(12) United States Patent
Doan et al.

(10) Patent No.: US 6,804,039 B1
(45) Date of Patent: Oct. 12, 2004

(54) MULTILAYER HINGE STRUCTURES FOR MICRO-MIRROR ARRAYS IN PROJECTION DISPLAYS

(75) Inventors: Jonathan C. Doan, Mountain View, CA (US); Satyadev R. Patel, Sunnyvale, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 0 days.

(21) Appl. No.: 10/692,386

(22) Filed: Oct. 22, 2003

(51) Int. Cl.[7] .............................................. G02F 26/00
(52) U.S. Cl. ....................... 359/291; 359/290; 359/292; 359/297
(58) Field of Search ................................ 359/290, 291, 359/292, 295, 297, 298, 237, 238, 223, 224

(56) References Cited

U.S. PATENT DOCUMENTS

| | | | |
|---|---|---|---|
| 4,662,746 A | 5/1987 | Hornbeck | 359/223 |
| 4,710,732 A | 12/1987 | Hornbeck | 359/291 |
| 5,061,049 A | 10/1991 | Hornbeck | 359/224 |
| 5,083,857 A | 1/1992 | Hornbeck | 359/291 |
| 5,202,785 A | 4/1993 | Nelson | 359/214 |
| 5,233,456 A | 8/1993 | Nelson | 359/214 |
| 5,280,277 A | 1/1994 | Hornbeck | 345/108 |
| 5,567,334 A * | 10/1996 | Baker et al. | 216/24 |
| 2002/0185699 A1 | 12/2002 | Reid | 257/414 |
| 2003/0036215 A1 | 2/2003 | Reid | 438/52 |
| 2004/0125347 A1 * | 7/2004 | Patel et al. | 353/98 |

* cited by examiner

Primary Examiner—Tim Thompson
(74) Attorney, Agent, or Firm—Gregory R Muir (57) ABSTRACT

A method and an improved multilayer hinge structure for use in a micromirror device for a spatial light modulator are provided herein. The micromirror device presents a conductive, composite torsion hinge with improved mechanical reliability, achieved by optimizing the geometry of the hinge, which minimizes the amount of residual twist, fixed torsional stiffness and fixed rate of plastic deformation in the mechanically undesirable hinge element. A method and its alternatives are disclosed herein by the present invention for manufacturing such multilayer hinge structure.

92 Claims, 8 Drawing Sheets

MULTILAYER HINGE STRUCTURES FOR MICRO-MIRROR ARRAYS IN PROJECTION DISPLAYS

TECHNICAL FIELD OF THE INVENTION

The present invention is related generally to spatial light modulators, and, more particularly, to hinge structures of the spatial light modulators and methods for making the same.

BACKGROUND OF THE INVENTION

Spatial Light Modulators (SLMs) are transducers that spatially modulate incident light beams according to optical or electrical input signals. A type of SLM is the microelectromechanical system (MEMS)-based SLM, which often consists of an array of micro-mirrors. The micromirrors of the array can be individually addressed and independently deflected by electrostatic forces.

Currently, a variety of MEMS-based SLMs for use in display systems has been developed. Regardless of the differences, a common basic configuration of the MEMS-based SLMs comprises a hinge and a micro-mirror plate that is attached to the hinge. In the display operation, the mirror plate rotates relative to a substrate of the micromirror so as to reflect incident light beams onto or away from a display target. In this regard, mechanical properties of the hinge and the micro-mirror plate and the attachment of the two are critical factors to the overall performance of the micromirrors and the quality of the displayed images.

In particular, since the hinges are often electrically conductive, they consist of metals, metal alloys, metal nitrides or metal silicides. While these materials may have the requisite conductivity, they are often poor mechanical elements, especially when compared to ceramic materials used in MEMS (e.g. silicon, silicon nitride, or silicon dioxide). The mechanical reliability problems arising from poor mechanical properties could include fracture, fatigue, plasticity, dislocation motion and creep. Because the reliability of a torsion hinge depends upon the amount of residual twist, which is caused by the rotation of the mirror plate, in the hinge as a function of the actuation time, it is necessary then to minimize the amount of residual twist at fixed torsion stiffness and fixed rate of plastic deformation in the mechanically undesirable element.

Therefore, what is needed is a spatial light modulator having micro-mirrors with robust mechanical properties for use in display systems.

SUMMARY OF THE INVENTION

In view of the foregoing, the present invention provides an improved multilayer hinge structure for use in a micro-mirror device for a spatial light modulator that has improved mechanical performance and robustness due do its geometrically optimized hinge structure.

In an embodiment of the invention, a spatial light modulator is provided. The spatial light modulator comprises: an array of micro-mirrors on a substrate, each micro-mirror of the array comprising a reflective mirror plate held by a hinge on the substrate, wherein the mirror plate and hinge extend substantially parallel to the substrate when the mirror plate is in an undetected position, wherein the hinge is a multilayer hinge having a first and second layer wherein the first layer is more electrically conductive than the second layer, and wherein the first layer is more narrow than the second layer in a direction substantially parallel to the substrate.

In yet another embodiment of the invention, a spatial light modulator is provided. The spatial light modulator comprises: an array of micro-mirrors on a substrate, each micro-mirror of the array comprising a reflective mirror plate held by a hinge on the substrate at the contact, wherein the mirror plate and hinge extend substantially parallel to the substrate when the mirror plate is in an undeflected position, wherein the hinge is a multilayer hinge having a first and second layer wherein the first layer has a creep rate higher than that of the second layer at the operating temperature of the spatial light modulator, and wherein the first layer is more narrow than the second layer in a direction substantially parallel to the substrate.

In yet another embodiment of the invention, a method of making a micro-mirror device, the device comprising a hinge and a micro-mirror plate attached to the hinge such that the micro-mirror plate can rotate relative to the substrate by the hinge, is disclosed. The method comprises: providing a substrate; depositing a first sacrificial layer on the substrate; forming either a hinge or a micro-mirror plate on the first sacrificial layer; depositing a second sacrificial layer; forming a micro-mirror plate or hinge on the second sacrificial; wherein the forming of the hinge on either the first or second sacrificial layer comprises: depositing a second layer comprised of a material with a creep rate lower than that of the first layer; depositing a first layer that comprises a material with a creep rate higher than that of the second layer, patterning the first layer so as to have a width that is 50% or less of the width of the second layer; and forming a hinge support to connect the hinge directly or indirectly to the substrate; and removing the first and second sacrificial layers so as to release the micro-mirror device.

In yet another embodiment of the invention, a method of making a micro-mirror device, the device comprising a hinge and a micro-mirror plate attached to the hinge such that the micro-mirror plate can rotate relative to the substrate by the hinge, is disclosed. The method comprises: providing a substrate; depositing a first sacrificial layer on the substrate; forming either a hinge or a micro-mirror plate on the first sacrificial layer; depositing a second sacrificial layer; forming a micro-mirror plate or hinge on the second sacrificial; wherein the forming of the hinge on either the first or second sacrificial layer comprises: depositing a second layer comprised of a material with a resistivity higher than $10^{12}$ $\mu\Omega \cdot cm$ at the operating temperature of the device; depositing a first layer that comprises a material with a resistivity less than that of the second layer; patterning the first layer so as to have a width that is 50% or less of the width of the second layer; and forming a hinge support to connect the hinge directly or indirectly to the substrate; and removing the first and second sacrificial layers so as to release the micro-mirror device.

In yet another embodiment of the invention, a method of making a micro-mirror device, the device comprising a hinge and a micro-mirror plate attached to the hinge such that the micro-mirror plate can rotate relative to a substrate by the hinge, is disclosed. The method comprises: providing the substrate; depositing a first sacrificial layer on the substrate; forming the micro-mirror plate on the first sacrificial layer, depositing a second sacrificial layer on the micro-mirror plate; patterning the second sacrificial layer according to a structure of the hinge; forming the hinge on the patterned second sacrificial layer, further comprising: depositing a bottom layer that comprises a material with resistivity higher than $10^{12}$ $\mu\Omega \cdot cm$ at the operating temperature of the device; depositing a top layer that comprises a material with resistivity lower than 100,000 $\mu\Omega \cdot cm$ at the operating temperature of the device; narrowing the topmost layer to cover at least 50% of the bottom layer surface by means of patterning and/or etching; and providing a means to connect the bottom and top layers directly or indirectly to the substrate; and removing the first and second sacrificial layers so that the bottom and top layers are free to move relative to the substrate.

In yet another embodiment of the invention, a method of making a micro-mirror device, the device comprising a hinge and a micro-mirror plate attached to the hinge such that the micro-mirror plate can rotate relative to a substrate by the hinge, is disclosed. The method comprises: providing the substrate; depositing a first sacrificial layer on the substrate; forming the micro-mirror plate on the first sacrificial layer, depositing a second sacrificial layer on the micro-mirror plate; patterning the second sacrificial layer, forming the hinge on the patterned second sacrificial layer so as to connect to both the micro-mirror plate and the substrate, the forming the hinge comprising: depositing a layer that comprises an electrical conductor, depositing a layer that comprises an electrical insulator; depositing a layer that comprises an electrical conductor, wherein at least one of the electrical conductor layers has a width 50% or less than that of the width of the insulator, and removing the first and second sacrificial layers such that the micro-mirror plate is free to move relative to the substrate.

In yet another embodiment of the invention, a microelectromechanical device is provided. The device comprises: one or more movable elements on a substrate, each movable element comprising a plate held by a hinge on the substrate, wherein the plate and hinge extend substantially parallel to the substrate when the plate is in an undeflected position, wherein the hinge is a multilayer hinge having a first layer that is more electrically conductive than a second layer, and wherein the first layer is more narrow than the second layer in a direction substantially parallel to the substrate.

In yet another embodiment of the invention, a micromirror device is provided. The device comprises: a substrate; a mirror plate; and a hinge, to which the mirror plate is attached such that the mirror plate rotates along the hinge, the hinge further comprising: a first layer having a first stress gradient; a second layer formed on and contact the first layer such that the first layer has a stress gradient that is less than the first stress gradient.

In yet another embodiment of the invention, a multilayer hinge for use in a micro-mirror device is disclosed. The multilayer hinge comprises: a top metal layer with non-rectangular shape, wherein the metal is an elemental substance or an alloy or a metalloid; a bottom metal layer with non-rectangular shape, where the metal is an elemental substance or an alloy or a metalloid; and an intermediate ceramic layer between the top and bottom metal layer.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

Processes for micro-fabricating a MEMS device such as a movable micro-mirror and mirror array are disclosed in U.S. Pat. Nos. 5,835,256 and 6,046,840 both to Huibers, as well as U.S. patent application Ser. No. 10/365,951 to Doan et al. filed Feb. 12, 2003, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in the present application. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use.) Regardless, a portion of the substrate, for visible light applications, is preferably transmissive to visible light during use so that light can pass into the device, be reflected by the mirrors, and pass back out of the device. Of course, not all embodiments will use a light transmissive substrate. By "wafer" it is meant any substrate on which multiple micro-mirrors or microstructure arrays are to be formed and which allows for being divided into dies, each die having one or more micro-mirrors thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6" or 12" in diameter) so as to allow for manufacture in a standard foundry.

U.S. patent applications Ser. No. 09/910,537 filed Jul. 20, 2001, and U.S. patent application Ser. No. 60/300,533 filed Jun. 22, 2001 both to Reid contain examples of materials that may be used for the various components of the current invention. These applications are incorporated herein by reference.

Figure 1:
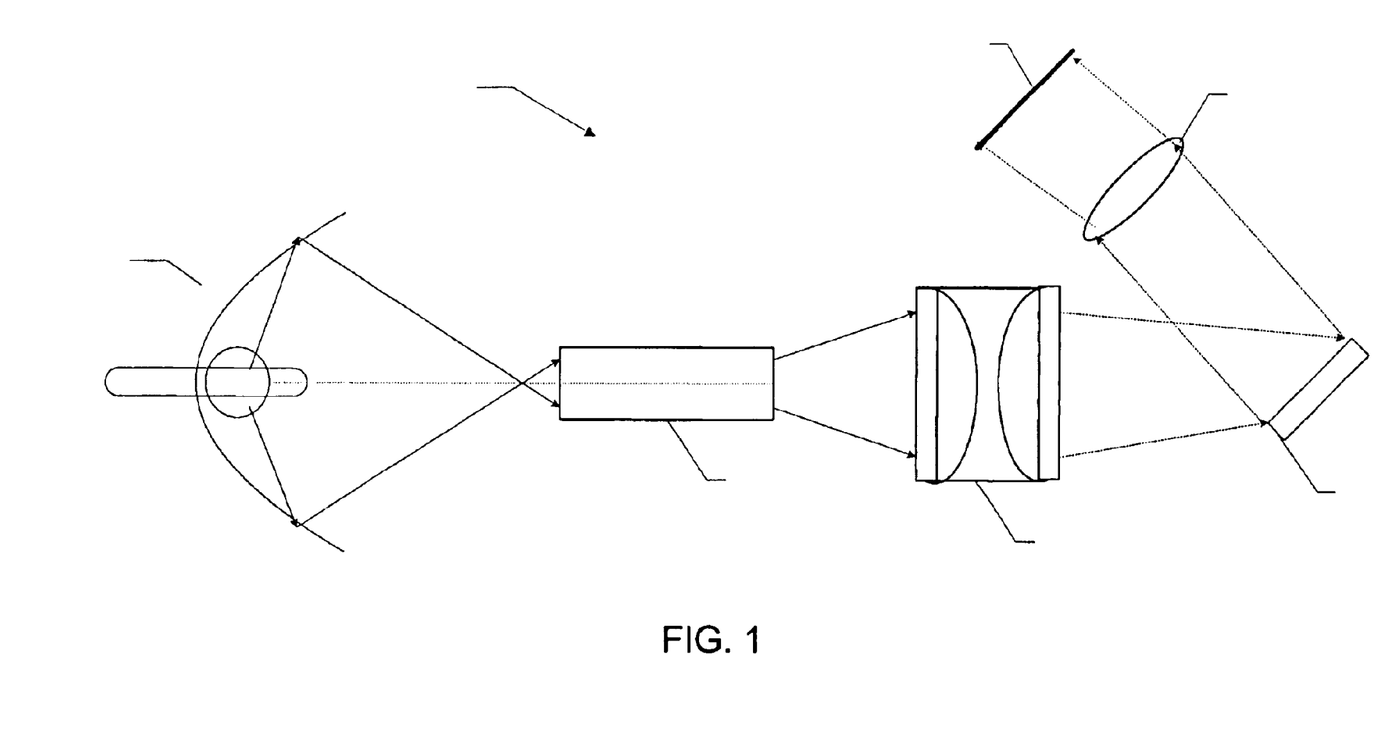
FIG. 1 is a diagram illustrating an exemplary display system employing a spatial light modulator.

The spatial light modulator having micromirrors with improved hinge structures detailed in the present invention has a variety of applications, one of which is in display systems. An exemplary display system employing a spatial light modulator is illustrated in FIG. 1. In its very basic configuration, the display system comprises light source 120, optical devices (e.g. light pipe 150, lens 160 and 190), display target 210 and spatial light modulator 200. Light source 120 (e.g. an arc lamp) directs light through the optical devices (e.g. light pipe 150 and object lens 160) and shines on spatial light modulator 200. Spatial light modulator 200 selectively reflects the incident light toward optical device 190 and results in an image on display target 210.

Figure 2:
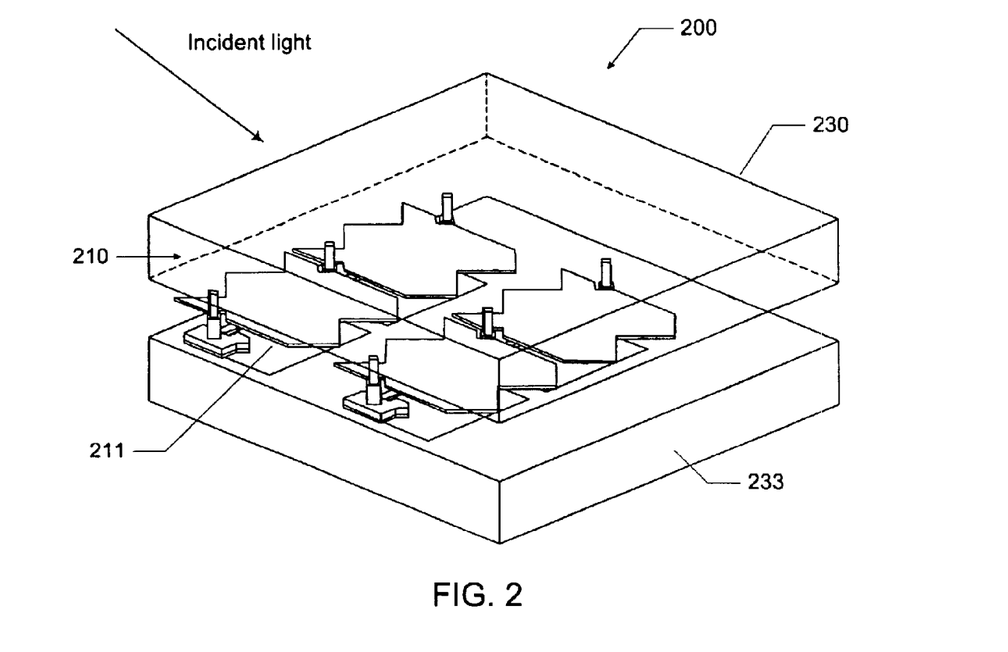
FIG. 2 is a perspective view of a portion of an exemplary spatial light modulator in FIG. 1.

In general, the spatial light modulator comprises an array of thousands or millions of micro-mirrors, only four being shown in FIG. 2 for simplicity and demonstration purposes only. Referring to FIG. 2, micro-mirror array 210 is formed on substrate 200, which is glass that is transmissive to visible light. Substrate 233 having an array of electrodes (e.g. electrode 211) and circuitry (not shown) formed thereon is placed proximate to the micro-mirror array. In operation, the micromirrors can be individually selected. The mirror plates of the selected micromirrors rotate relative to the substrate (e.g. substrate 230) in response to the electrostatic forces established between these mirror plates and the electrodes associated with these mirror plates; thereby the spatial modulation of the incident light beam traveling through substrate 200 and onto the surfaces of the mirror plates can be achieved.

Figure 3:
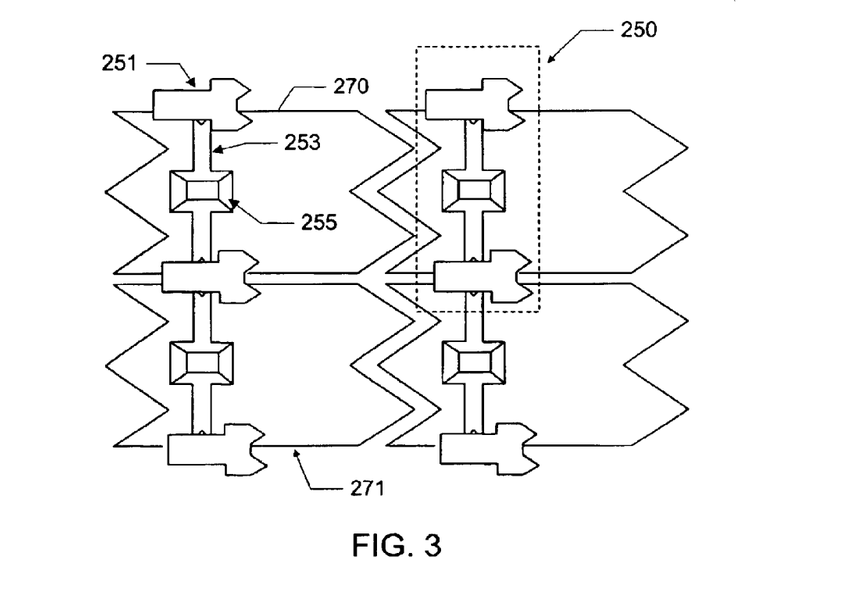
FIG. 3 is a back-view of a portion of a micro-mirror array of the spatial light modulator in FIG. 2.

Referring to FIG. 3, a back-view of the micro-mirror array shown in FIG. 2 is illustrated therein. As shown, each mirror plate, such as mirror plate 270, is attached to a hinge structure (e.g. hinge structure 250) such that the micro-mirror plate can rotate relative to the substrate along the hinge structure in a space between the two substrates (e.g. substrates 230 and 233 in FIG. 2). In order to improve the quality of displayed images by reducing incident light scattering from the hinge structure, the hinge structure is preferably formed underneath the micro-mirrors as shown. Specifically, the hinge structure and the surface for reflecting the incident light are on the opposite sides of the micro-mirror plate. Each hinge structure further comprises a plurality of posts (e.g. posts 251), hinge 253 and contact area 255. By "hinge" is meant the layer or stack of layers that defines that portion of the device that flexes to allow movement of the device (described in detail below). Though it is preferred that the posts and the contact area are formed in-line, this is not an absolute requirement. Instead, any suitable geometric configurations may also be used.

Figure 4A:
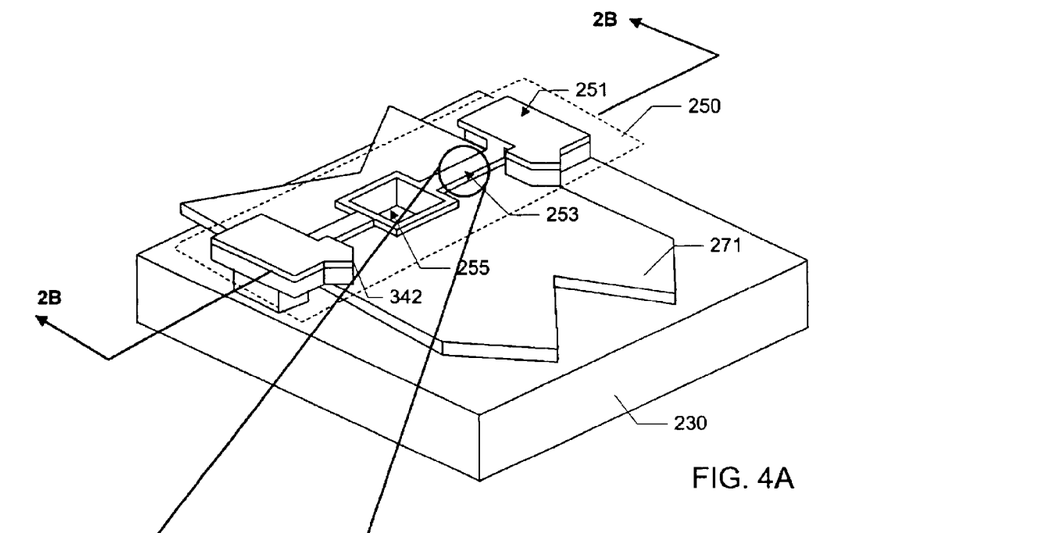
FIG. 4A demonstrates a portion of an exemplary micro-mirror device of the micro-mirror array in FIG. 3.

Referring to FIG. 4A, a perspective view of a portion of the micro-mirror device in FIG. 3 is illustrated therein. In its basic configuration, hinge structure 250 comprises posts 251, hinge 253 and contact 255. Micro-mirror 270 is attached to the hinge at the contact such that it can rotate relative to the substrate along the hinge. The contact is preferably providing an electric contact with the micro-mirror such that the micro-mirror can be held at a particular voltage or electrically connected to the ground. Thereby, the rotation of the micro-mirror can be controlled by the applied electric field.

In operation, the micro-mirror plate rotates relative to the substrate along the hinge under the control of an electrostatic field and reflects incident light. This type of operation mechanism calls for certain requirements on the optical, mechanical and electric properties of the mirror plate, the hinge and the contact. In particular, the micro-mirror plate is desired to comprise a material having high reflectivity to the light of interest, for example, a material of an early transition metal, late transition metal, metalloid or alloy thereof. The micro-mirror content should be electrically conducting. By "conductor", it is meant a material whose resistivity is equal to or lower than 100,000 $\mu\Omega$cm, such as Al, Ti, $TiN_x$ or $TiSi_xN_y$. And by "insulator", it is meant a material whose resistivity is higher than $10^{12}$ $\mu\Omega$cm. In addition, it is desired that the material of the micro-mirror hinge also exhibits suitable mechanical properties (e.g. low creep rate, high fatigue strength and high elastic modulus etc.) for enhancing the mechanical property of the micro-mirror. Furthermore, it is desired that the material of the micro-mirror plate is electrically conductive such that an electric field can cause movement thereof.

The hinge structure allows the micro-mirror plate to rotate relative to the substrate. Because the hinge structure may scatter incident light and the scattered light can enter the projection optics even when pixels are in the OFF state, the contrast ratio may be degraded. In order to suppress this type of scattering, the hinge structure is preferably "hidden" beneath the micro-mirror plate. For example, the hinge structure can be formed on a side that is opposite to the reflecting side of the micro-mirror plate for reflecting incident light. In accordance with the operation mechanism of the micro-mirror device and the constructional design, it is desired that the posts comprise materials that are insusceptible to plastic deformation due to mechanisms like fatigue, creep or dislocation motion. It is preferred that such materials have large elastic modulus and exhibit high strength. The materials of the hinge (e.g. hinge 253) are expected to elastically deform because hinge deformation causes the micro-mirror to rotate. Moreover, the hinge is desired to be electrically conducting such that the hinge can effectively transmit external electric signals to the micro-mirror plate, thereby, set up an electric field between the micro-mirror plate and the associated one or more electrodes for rotating the micro-mirror plate. However, most electrically conducting materials are often poor mechanical elements, especially when compared to some ceramic materials used in MEMS (e.g. titanium silicon nitride, silicon nitride, or silicon dioxide). The mechanical reliability problems that could arise from the poor mechanical properties include fracture, fatigue, plasticity through dislocation motion, or creep. In view of this, the present invention provides hinge structures with improved mechanical properties by optimizing the geometry of the hinge so as to minimize the residual twist at fixed torsion stiffness and deformation rate, which will be discussed in detail in the following with reference to FIGS. 4B through 4F.

Figures 4B, 4C, 4D, 4E, 4F:
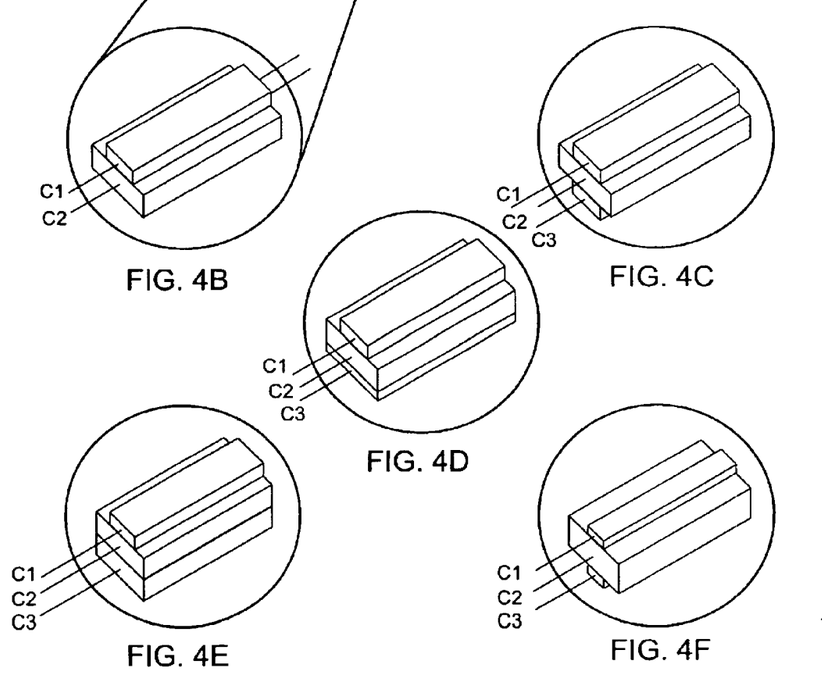
FIG. 4B through FIG. 4F are magnified cross-sectional views of patterned multilayered hinge structures according to different embodiments of the invention.

Referring to FIG. 4B, a magnified perspective view of a segment of the hinge of the micromirror in FIG. 4A according to an embodiment of the invention is illustrated therein. The hinge comprises multiple layers with different widths. Specifically, the top layer of the hinge has a reduced width as compared to the bottom layer. By "width of the hinge (or hinge layer)", it is meant the dimension of the hinge (or the hinge layer) in the direction perpendicular to the direction along the length of the hinge; and the direction of the length of the hinge is along a virtual line connecting the posts. In the embodiment of the invention, the top layer covers the area of the top surface of the bottom layer by 50% or less. Alternatively, the width of the top layer is 50% or less of the width of the bottom layer.

As an aspect of the embodiment, the two layers of the hinge are disposed such that the geometrical principal axes of the two layers, $C_1$ and $C_2$ are overlapped when viewed from the top. By "geometric principal axis of a layer", it is meant an axis that passes through the geometric center of the layer and is parallel to the length of the layer. Alternatively, the two central axes are offset but still parallel when viewed from the top, which is not shown in the figure. The thicknesses of the two layers may or may not be the same. In a more general situation, the two layers are disposed according to the distributions of the torsion stress and residual stress on the hinge in operation.

Rather than two layers, the hinge of the present invention may comprise more than two layers. A segment of an exemplary hinge having three layers according to another embodiment of the invention is illustrated in FIG. 4C. Referring to FIG. 4C, the hinge comprises a top layer, an intermediate layer and a bottom layer. The top and bottom layers have reduced widths compared to the intermediate layer. Specifically, the top and the bottom layers respectively cover the areas of the top and the bottom surfaces of the intermediate layer by 50% or less. Alternatively, each of the top and the bottom layers has a width that is 50% or less of the width of the intermediate layer. The thicknesses of the layers may or may not be the same.

Alternative to the hinge in FIG. 4C in which the top and bottom layers both have reduced widths, the bottom and intermediate layers may have the same width as shown in FIG. 4D. In this embodiment, the top layer covers the area of the top surface of the intermediate layer by 50% or less, and the three layers have different thicknesses. Specifically, the bottom layer has a reduced thickness as compared to the other two layers. Of course, the three layers each may have a different thickness. In another embodiment of the invention, the bottom and intermediate layers have the same thickness, while the top layer has a different thickness, which is shown in FIG. 4E. In this case, the top layer covers the area of the top surface of the intermediate layer by 50% or less.

According to yet another embodiment of the invention, the hinge comprises three layers with the top and bottom layers have reduced widths as compared to the intermediate layer, a segment of the hinge being illustrated in FIG. 4F. Referring to FIG. 4F, the top layer preferably covers the area of the top surface of the intermediate layer by 50% or less, more preferably by 33% or less, and more preferably by 25% or less. The bottom layer may or may not have the same width as the top layer. However, it is preferred that the bottom layer covers the area of the bottom surface of the intermediate layer by 50% or less, more preferably by 33% or less, and more preferably by 25% or less. The top and the bottom layers may have the same width, while the intermediate layer has a different width as compared to the top and bottom layers. Alternatively, all three layers may have the same width.

In the embodiments as discussed above with reference to FIGS. 4C through 4F, in which the hinge comprises three layers, the three layers are preferably disposed such that the central axes, $C_1$, $C_2$ and $C_3$, of the three layers are overlapped when viewed from the top. Alternatively, the three layers can be arranged such that the three central axes are mutually shifted for desired distances but still in parallel; or one axis is offset from but in parallel to the other two axes that are overlapped when viewed from the top.

Figure 4G:
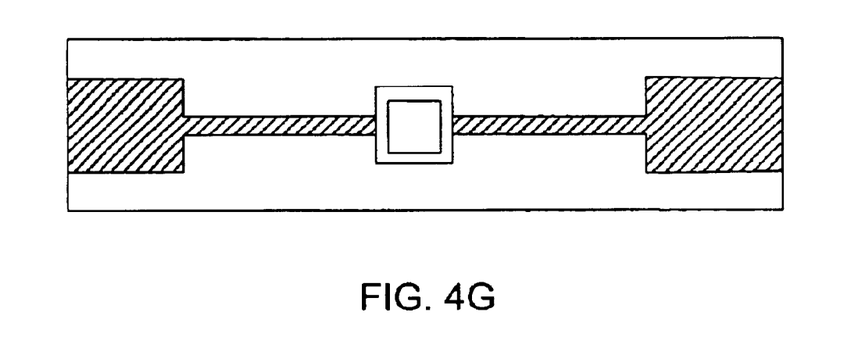
FIGS. 4G and 4H are top views of patterned multilayered hinge structures according to different embodiments of the invention.

In yet another embodiment of the invention, the hinge comprises three layers with either one of the top and bottom layers or both have non-rectangular shapes. Moreover, the width of the top layer (and/or the bottom layer) is not uniform along the length of the hinge. For example, the top (and/or the bottom) layer consists of at least two sets of hinge layer segments, as shown in FIG. 4G. The hinge layer segments of the same set have the same width, whereas the hinge layer segments of different sets have different widths. The segments of the same set may or may not have the same length. The top (and/or the bottom) layer comprises alternating hinge layer segments from different sets. It is preferred that the segments having a larger width in the top (and/or the bottom) layer of the hinge cover $$\frac{50}{100} \frac{m}{(m+n)}$$

or less of the top (and or the bottom) surface of the intermediate layer, wherein m is the number of segments having a larger width in the top layer of the hinge and is equal to or bigger than 1, and n is the number of the segments having a smaller width in the top layer of the hinge and is equal to or bigger than 1. It is further preferred that the segments having a smaller width in the top (and/or the bottom) layer of the hinge cover $$\frac{33}{100} \frac{n}{(m+n)}$$

or less, more preferably $$\frac{25}{100} \frac{n}{(m+n)}$$

or less of the top (and or the bottom) surface of the intermediate layer. In a general situation, the number segments from the sets and the geometric arrangement depend upon the torsion stress and residual stress on the hinge in operation.

Figure 4H:
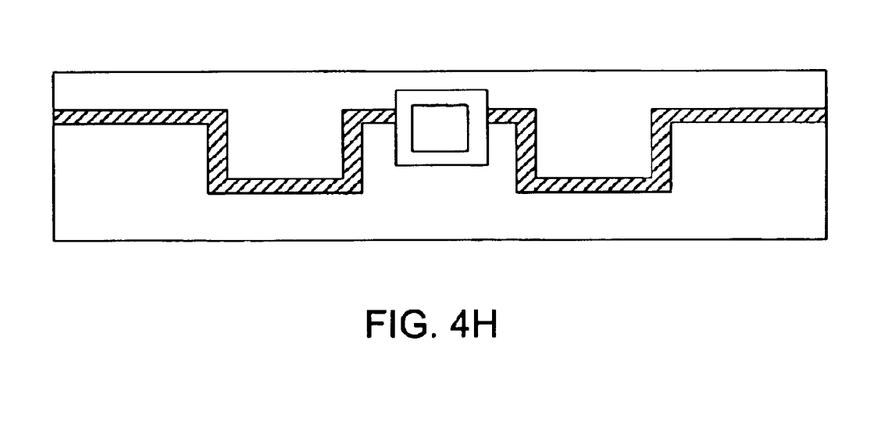

In another embodiment of the invention, the top (and/or the bottom) layer is composed of interconnected segments. The segments of the top (and/or the bottom) layer are disposed according to a predefined configuration, one of which is illustrated in FIG. 4H.

Though each hinge in the above described embodiments comprises two or three layers, the hinge may comprise more than three layers. For example, a fourth layer (now shown) may be formed on the three layers such that the three layers are wrapped inside the fourth layer. Of course, other hinge layers may be formed further.

There are a variety of ways to construct the micro-mirror devices described above. Exemplary processes will be discussed in the following with references to FIG. 5A through FIG. 6. It should be appreciated by those ordinary skills in the art that the exemplary processes are for demonstration only and should not be interpreted as limitations.

Figure 5A:
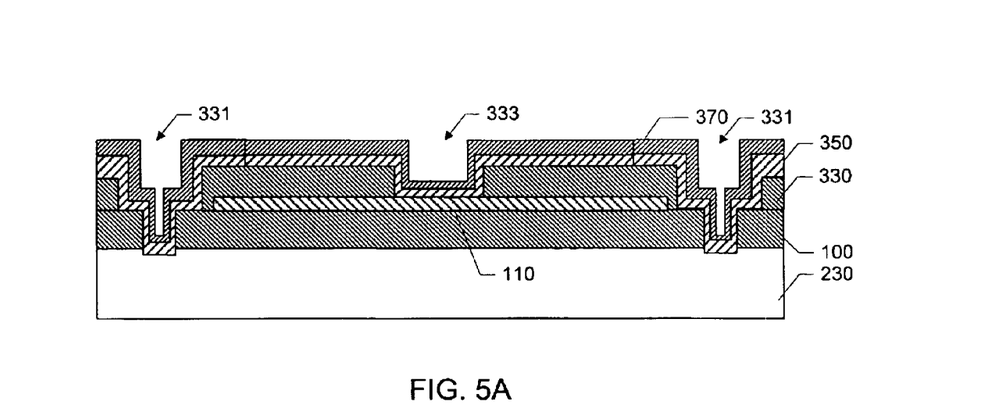
FIG. 5A is a cross-sectional view of the micro-mirror device of FIG. 4A before patterning the hinge structure layers during an exemplary fabrication process.

Referring FIG. 5A, substrate 230 is provided. First sacrificial layer 100 is deposited on the substrate followed by a deposition of micro-mirror plate layer 110. The substrate can be a glass (e.g. 1737F, Eagle 2000), quartz, Pyrex™, sapphire etc. The substrate may also be a semiconductor substrate (e.g. silicon substrate) with one or more actuation electrodes and/or control circuitry (e.g. CMOS type DRAM) formed thereon.

First sacrificial layer 100 is deposited on substrate 230. First sacrificial layer 100 may be any suitable material, such as amorphous silicon, or could alternatively be a polymer or polyimide, or even polysilicon, silicon nitride, silicon dioxide, etc. depending upon the structural materials selected to be resistant to the etchant, and the etchant selected. If the first sacrificial layer is amorphous silicon, it can be deposited at 300–350° C. The thickness of the first sacrificial layer can be wide ranging depending upon the micro-mirror size and desired tilt angle of the micro-mirror, though a thickness of 500 Å to 50,000 Å can be used; around 10,000 Å is preferred. The first sacrificial layer may be deposited on the substrate using any suitable method, such as LVD or PVD.

After depositing the first sacrificial layer, a plurality of structural layers will be deposited and patterned as appropriated. According to the invention, a structural layer is a layer that will not be removed during or after the removal of the sacrificial layers. The first structural layer deposited on the first sacrificial layer is micro-mirror plate layer 110 for forming a micro-mirror plate. Because the micro-mirror plate is designated for reflecting incident light in the spectrum of interest (e.g. visible light spectrum), it is preferred that the micro-mirror plate layer comprises of one or more materials that exhibit high reflectivity (preferably 90% or higher) to the incident light. Examples of such materials are Al, Ag, $AlSi_xCu_y$, $AlTi_x$ or $AlSi_x$. Of course, other suitable materials having high reflectivity to the incident light of interest may also be adopted for the micro-mirror plate. In depositing the micro-mirror plate layer, PVD is preferably used. The thickness of the micro-mirror plate layer can be wide ranging depending upon many factors, such as desired mechanical (e.g. stiffness and strength) and electrical (e.g. conductivity) properties, the size, desired rotation angle of the micro-mirror plate and the properties of the materials selected for the micro-mirror plate. According to the invention, a thickness of from 500 Å to 50,000 Å, preferably around 2500 Å, is preferred. If the micro-mirror plate layer comprises aluminum, it is preferred to be deposited at 150° C. to 300° C. or other temperatures preferably less than 400° C.

Micro-mirror plate layer 110 is then patterned into a desired shape, an example of which is illustrated in FIG. 4A. The shape illustrated in FIG. 4A is but one example of many possible mirror shapes. The patterning of the micro-mirror plate can be achieved using the standard photoresist patterning followed by etching using, for example $CF_4$, $Cl_2$, or other suitable etchant depending upon the specific material of the micro-mirror plate.

After the formation of the micro-mirror plate, second sacrificial layer 330 is deposited and patterned according to the desired configuration of the hinge structure. Second sacrificial layer 330 may comprise amorphous silicon, or could alternatively comprise one or more of the various materials mentioned above in reference to first sacrificial layer 100. Similar to the first sacrificial layer, second sacrificial layer 330, which need not be the same as the first layer, may be deposited using any suitable method, such as LPCVD or PECVD. If the second sacrificial layer comprises amorphous silicon, the layer can be deposited around 350° C. The thickness of the second sacrificial layer can be on the order of 9000 Å, but may be adjusted to any reasonable thickness, such as between 2000 Å and 20,000 Å depending upon the desired distance (in the direction perpendicular to the micro-mirror plate and the substrate) between the micro-mirror plate and the hinge. Second sacrificial layer 330 may also fill in the trenches left from the patterning of the micro-mirror plate.

The deposited second sacrificial layer is patterned afterwards for forming two deep-via areas 331 and shallow via area 333 using standard lithography technique followed by etching. The etching step may be performed using $Cl_2$, $BCl_3$, or other suitable etchant depending upon the specific material(s) of the second sacrificial layer. The distance across the two deep-via areas 331 depends upon the side-to-side distance of the micro-mirror plate. In order to form shallow-via area 333, an etching step using $CF_4$ or other suitable etchant may be executed. The shallow-via area, which can be of any suitable size, is preferably on the order of 2.2 μm.

In order to form the desired deep-via area 331 profiles as shown, a via-mask and partial sacrificial layer etching are applied. According to an embodiment of the invention, the wider region of each deep-via area 331 is on the order of 1.0 to 2.0 μm, preferably 1.4 μm, and the smaller region is on the order of 0.5 to 1.5 μm, preferably 1.0 μm. Of course, other dimensions are possible depending upon the final size and shape of the micro-mirror plate. As an optional feature, the deep-via areas may reach through first sacrificial layer 100 and may reach from 500 Å to 2000 Å into substrate 230. As discussed above, the deep-via areas are formed in two etching steps. By doing so, the effect of resist erosion may be reduced, and step coverage of $SiN_x$ in the subsequent deep-via fill deposition may be improved. However, a single etching step can also be used.

After patterning the second sacrificial layer, hinge structure layers 350 and 370 are deposited on the patterned second sacrificial layer 330. During the deposition, layers 350 and 370 fill the formed deep-via areas 331 and shallow-via area 333. Because the hinge structure layers are designated to form the posts (e.g. 251 in FIG. 4) for holding the hinge (e.g. 253 in FIG. 4A) and the micro-mirror plate (e.g. 270 in FIG. 4A) attached thereto such that the micro-mirror plate can rotate relative to the substrate by the hinge, it is desired that the hinge structure layers (e.g. 350 and 370) comprise materials having a sufficiently modulus to provide necessary stiffness. According to an embodiment of the invention with only two layers, layer 350 comprises a 300 Å thickness of $TiN_x$ layer deposited by PVD, and layer 370 comprises a 3500 Å thickness of $SiN_x$ layer deposited by PECVD. Of course, other suitable methods of deposition may be used, such as LPCVD or sputtering. Alternatively, layer 350 can be a Ti layer with a preferred thickness of 200 Å. Layer 350 is not necessary for the invention, but provides a conductive contact surface between the micro-mirror and the hinge structure in order to, at least, reduce charge-induced stiction. It is preferable to deposit the $TiN_x$ and SiNx layers such that the intrinsic stress is as low as possible; preferably lower than 250 MPa. The $SiN_x$ layer can be deposited at 400° C. Of course, other suitable materials, such as $CoSiN_x$, $TiSiN_x$ and/or $TiO_x$ may also be used for the hinge structure. As an optional feature of the invention, layer 350 is not deposited and only layer 370 is deposited for the hinge structure. In this case, layer 370 is $SiN_x$ with a thickness of 1000 Å to 10,000 Å, preferably 4000 Å.

Figure 5B:
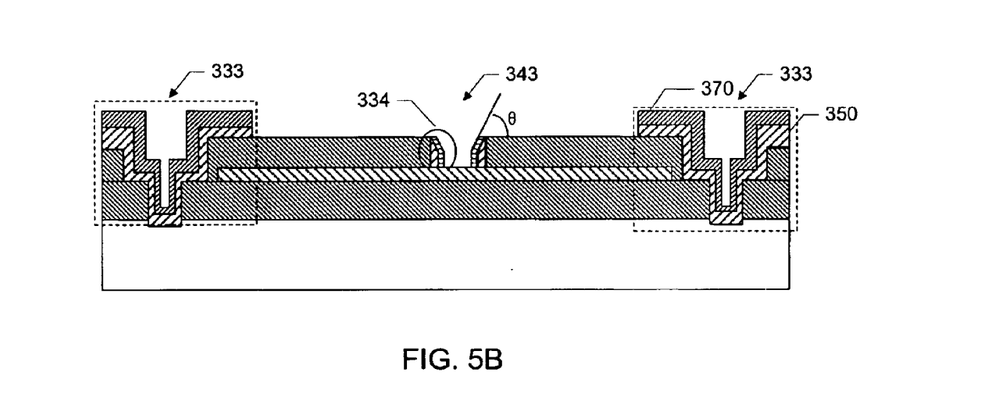
FIG. 5B is a cross-sectional view of the micromirror device in FIG. 5A after patterning the hinge structure layers.

After the deposition, layers 350 and 370 are then patterned for forming the two posts 333 and contact 343 by etching using one or more proper etchants, as shown in FIG. 5B. In particular, the layers can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers, etc.).

Alternatively, the etching step can be performed after deposition of each hinge layer. For example, layer 350 can be etched and patterned after the deposition of layer 350 and before the deposition of layer 370.

After etching, two posts 333 and contact 343 are formed. According to the embodiment of the invention, each of the two posts 333 is formed with a tip 342 (as shown in FIG. 4A) for limiting the rotation of the micro-mirror plate in operation. The physical configuration (e.g. position and length) of the tip, along with the distance between the micro-mirror plate and the substrate, determines the maximum rotation angle of the micro-mirror plate, wherein the maximum rotation angle can be used to define the "ON" state of the micro-mirror device. In this situation, a uniform configuration of the tips of all individual micro-mirror devices ensures a uniform "ON" state for all micro-mirror devices. This certainly improves the performance of the micro-mirror devices, thus improves the quality of displayed images.

The bottom segment of contact 343 is removed by etching and a part of the micro-mirror plate is thus exposed. The exposed part of the micro-mirror plate will be used to form an electric-contact with external electric source. The sidewalls of contact 343 are left with residues of layers 350 and 370 after etching. The residue 334 has a slope measured by angle θ approximately 75 degrees, but may vary between 0 and 89 degrees.

Figure 5C:
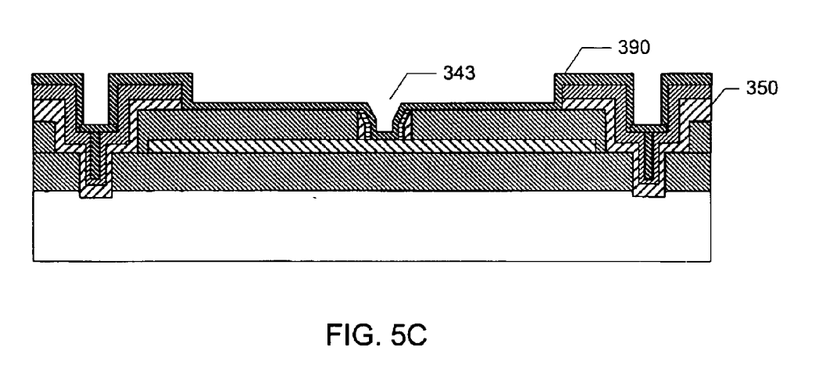
FIG. 5C is a cross-sectional view of the micromirror device in FIG. 5B after depositing and patterning hinge layers.

After the completion of patterning of layers 350 and 370, hinge layer 390 is deposited and then patterned as shown in FIG. 5C. Because the hinge deforms with the micro-mirror plate rotating, it is expected that the hinge is more susceptible to plastic deformation (e.g. fatigue, creep or dislocation motion). Furthermore, when the hinge is also used as electric conducting media for the micro-mirror plate, it is further expected that the hinge is electrically conductive.

Figure 5D:
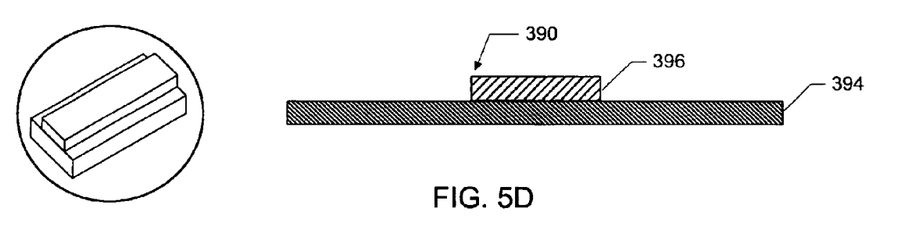
FIGS. 5D, 5E, 5F, 5G, and 5H are cross-sectional views of the multilayer hinge structure according to different embodiments of the invention.

According to an embodiment of the invention, hinge 390 is a multilayered structure, as shown in FIG. 5D. Referring to FIG. 5D, hinge 390 comprises layers 396 and 394. The upper layer 396 is an electric conductor, such as an elemental metal substance, metalloid, inter-metallic compounds, conductive ceramics and metal alloys, and the lower layer is an electric insulator, such as a ceramic. For example, the upper layer may comprise $TiN_x$, aluminum, titanium, Ir, Cu, W, titanium oxide(s), titanium carbide, $CoSi_xN_y$, $WAl_{x1}$, $NiAl_x$, $TiSi_xN_y$, $TaSi_xN_y$, $CoSi_xO_y$, or other ternary compositions such as set forth in U.S. patent applications Ser. No. 09/910,537 to Reid filed Jul. 20, 2001 and U.S. patent application Ser. No. 10/198,389 to Reid, filed Jul. 16, 2002, each incorporated herein by reference. In the preferred embodiment of the invention, the upper layer is $TiN_x$. The lower layer 394 can be any suitable ceramic, such as $SiN_x$, $SiO_x$, or silicon carbide. Therefore, a $TiN_x$—$SiN_x$ double layer structure is preferably formed for the hinge. Alternatively W—$SiN_x(SiO_y)$, Al—$SiN_x(SiO_y)$l, Ti—$SiN_x(SiO_y)$ or Ti(Al)-$SiN_x(SiO_y)$-double layer structure can also be formed for the hinge structure.

Figure 5E:
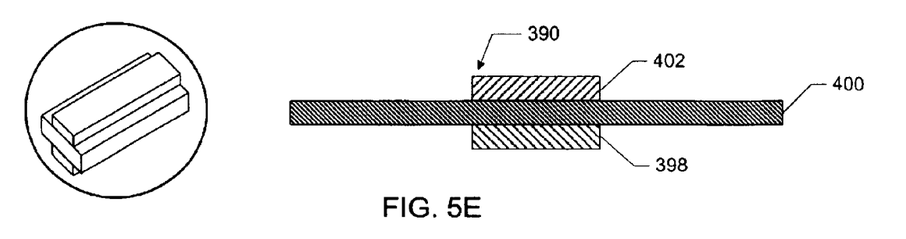
Figure 5F:
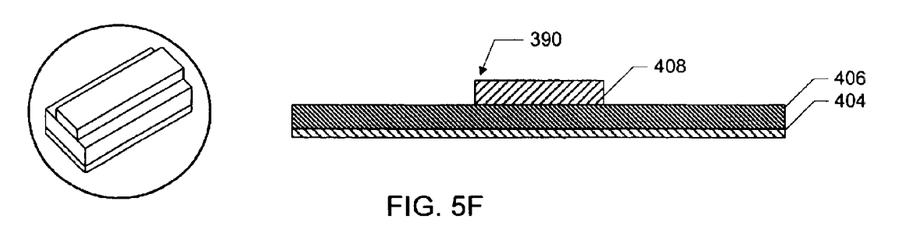
Figure 5G:
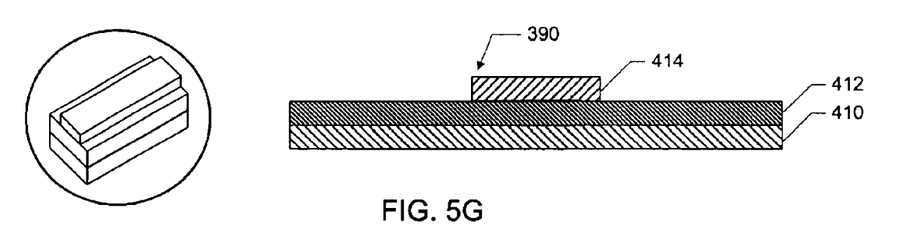

According to another embodiment of the invention, hinge 390 is a multilayered structure, as shown in FIG. 5E, wherein hinge 390 comprises layers 398, 400 and 402. The outside layers 398 and 402 are electric conductors, such as an elemental metal substance, metalloid, inter-metallic compounds, conductive ceramics and metal alloys, while the intermediate layer 400 is an electric insulator, such as a ceramic. Examples for specific materials for these layers are set forth above in relation to FIG. 5D. In this embodiment of the invention the outer layers are narrower than the insulating layer in a direction substantially parallel to the substrate. In one example, layer 402 covers the lower insulating layer by 50% or less of its surface while the outer conductive layer 398 presents the same geometry as layer 402. The objective of this geometry optimization is to produce a conductive, composite torsion hinge with improved mechanical reliability, minimizing the amount of residual twist at fixed torsional stiffness and reduced rate of plastic deformation in the mechanically undesirable element. Depending on the mechanical properties sought, the geometry of the layers that make up hinge 390 can be changed as shown in FIGS. 5E, 5F, 5G and 5H, wherein cross sections of the different embodiments of the invention and their corresponding perspective views are shown. It will be appreciated by those of ordinary skill in the art that neither the percentage of the surface covered by the outer layers nor the detailed geometry shown on FIGS. 5D, 5E, 5F, 5G and 5H should be interpreted as a limitation. Instead, any number of layers could be used as desired, and thicknesses and widths of the layers could differ from that shown, which variations can be employed without departing from the spirit of the present invention. And, whether two layers or more, the narrower layer could cover layer 400 only up to 33% of the surface of layer 400, up to 25%, or even only up to 10% (of course taken into account line width constraints of the fabrication process). As illustrated, the layer(s) with the lower surface area could have a narrower width and be positioned in the middle of layer 400 as shown, or could be provided as a plurality of narrower strips, or be positioned towards the side of layer 400 (not shown). In any case, the total volume of the more conductive layer (398 or 402) is less than the more insulating layer (400), the surface area is less, and preferably the width of the layer is no more than 50% of the width of the more insulating layer.

Figure 5H:
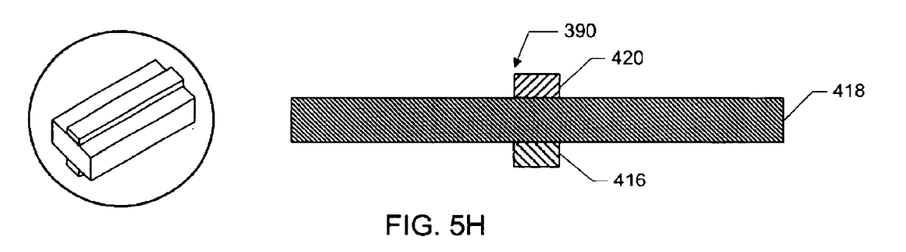

The thicknesses of the hinge layers can be adjusted depending on the materials selected and the desired mechanical and electric properties of the hinge, the stiffness of the movable element, the desired flexibility of the hinge, or other relevant factors. For example, for a Ti—$SiN_x$—Ti hinge stack, layer thicknesses on the order of 100-600-100 Å are preferred. For an Al—$SiO_x$—Ti triple structure, layer 398 is aluminum with a preferred thickness of 2500 Å for providing an efficient electric contact with the micro-mirror plate, and layer 402 is titanium with a preferred thickness of 80 Å. The intermediate layer 400 is a ceramic insulating layer, such as $SiO_2$ with a thickness of 400 Å, for properly insulting layers 398 from 402. Furthermore, the ceramic insulating layer 400 may also enhance mechanical properties, such as creep resistance and/or resistance to plastic deformation, of the hinge. Of course, these layer thicknesses can vary widely depending on any of the above factors. The layer thicknesses can also be adjusted to affect the overall intrinsic stress of the hinge. For example, in another embodiment of the invention, wherein hinge 309 comprises layers 416, 418 and 420 as shown in FIG. 5H, if each of the outside layers 416 and 420 exhibits an intrinsic stress of −100 MPa (compressive) and intermediate layer 394 exhibits an intrinsic stress of +150 MPa (tensile), the thickness of the intermediate layer can be increased to ensure that the average intrinsic stress is tensile. If the intermediate layer thickness is increased to three times that of the outside layers, the average intrinsic stress is given by [(−100)* 2+(150)* 3]/ (2+3), or +50 MPa (tensile).

According to another embodiment of the invention, hinge 390 comprises an electrically conducting layer 396 consisting of a material having a resistivity less than 100,000 $\mu\Omega$·cm at the operating temperature of the device. The bottom layer 394 is an insulator with a resistivity greater than $10^{12}$ $\mu\Omega$·cm at the operating temperature of the device. Depending on the mechanical properties sought, the geometry of the layers that make up hinge 390 can be changed as already set forth above in relation to FIG. 5D.

According to yet another embodiment of the invention as shown in FIG. 5E, hinge 390 further comprises layers 398, 400 and 402. The topmost layer 402 is an electrically conductive layer that comprises a material having a resistivity less than 100,000 $\mu\Omega \cdot cm$ at the operating temperature of the device. The intermediate layer 400 is an insulator with a resistivity greater than $10^{12}$ $\mu\Omega \cdot cm$ at the operating temperature of the device, and layer 398 is an electrically conductive layer with a resistivity also less than 100,000 $\mu\Omega \cdot cm$ at the operating temperature of the device. The geometry of the layers that comprise the hinge can be changed as already set forth regarding FIG. 5D.

According to another embodiment of the invention, hinge 390 comprises a top layer 396 which has a resistance to a gas-phase etchant higher than that of the intermediate layer 394. And layer 392 has a higher resistance than the intermediate layer 394 to the gas-phase etchant. As already set forth above relating to FIG. 5D, the geometry of the hinge can be adjusted to reflect that of the FIGS. 5E, 5F, 5G and other possible variations without departing from the spirit of the invention.

In yet another embodiment of the invention, the intermediate layer 400 provides an electric contact with the micro-mirror plate. Ideal materials for this layer are expected to be "good" conductors (e.g. with high electric conductivity). In addition, it is expected that the materials of this layer exhibit proper mechanical properties, such as high strength and large elastic modulus. A typical candidate material is titanium. Other suitable materials, such as Cu and silver can also be used for layer 400. However, these materials, especially titanium, exhibit low resistances to oxidation. When used alone for the hinge, titanium hinge is oxidized, and desired mechanical and electrical properties would not be guaranteed. In order to diminish the oxidation of layer 400, the bottom layer 398 and the top layer 402 are deposited for passivating the oxidation of the intermediate layer 400. Layers 398 and 402 may comprise materials with high resistances to oxidation. Exemplary materials for these two layers are aluminum, $SiN_x$, $SiO_x$, Cr, $TiN_x$ and Au. Alternatively, an additional layer (not shown) can be deposited on the intermediate layer 400 before depositing the top layer 402. The additional layer can be deposited for enhancing the mechanical property of the hinge. Specifically, the additional layer can be $SiN_x$. In this regards, a tetra-layered structured, such as $TiN_x$—Ti—$SiN_x$—$TiN_x$ is formed for the hinge. As already set forth above relating to FIG. 5D, the geometry of the hinge can be adjusted to reflect that of the FIGS. 5E, 5F, 5G and other possible variations without departing from the spirit of the invention.

After deposition, the hinge layers are then patterned and etched. Similar to the hinge structure layers (layers 350 and 390), the hinge layers can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers, etc.). Alternatively, the hinge layers 398, 400 and 402 can be patterned and etched consecutively after depositions according to the desired geometry.

Figure 6:
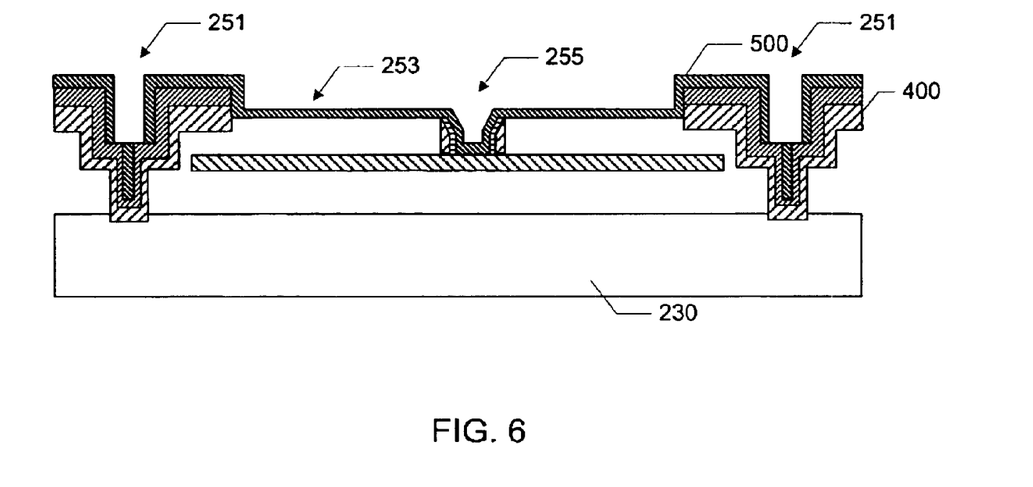
FIG. 6 is the cross-sectional view of the micromirror device in FIG. 5D after removing the sacrificial layers.

Finally, the first and second sacrificial layers 100 and 330 are removed using etching so as to release micro-mirror plate 110. FIG. 6 shows a cross-sectional view of the micro-mirror device after releasing. As can be seen in the figure, posts 251 is formed on substrate 230 and hold hinge 253, to which micro-mirror plate 110 is attached. The micro-mirror plate is capable of rotating relative to the substrate by the hinge.

The release etch preferably utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Patel et al. filed Oct. 26, 1999, and in U.S. patent application Ser. No. 09/649,569 to Patel at al. filed Aug. 28, 2000, the subject matter of each being incorporated herein by reference. Preferred etchants for the release etch are spontaneous chemical vapor phase fluoride etchants that, except for the optional application of temperature, are not energized. Examples include HF gas, noble gas halides such as xenon difluoride, and interhalogens such as $IF_5$, $BrCl_3$, $BrF_3$, $IF_7$ and $ClF_3$. The release etch may comprise additional gas components such as $N_2$ or an inert gas (Ar, Xe, He, etc.). In this way, the remaining sacrificial material is removed and the micromechanical structure is released. In one aspect of such an embodiment, $XeF_2$ is provided in an etching chamber with diluent (e.g. $N_2$ and He). The concentration of $XeF_2$ is preferably 8 Torr, although the concentration can be varied from 1 Torr to 30 Torr or higher. This non-plasma etch is employed for preferably 900 seconds, although the time can vary from 60 to 5000 seconds, depending on temperature, etchant concentration, pressure, quantity of sacrificial material to be removed, or other factors. The etch rate may be held constant at 18 Å/s/Torr, although the etch rate may vary from 1 Å/s/Torr to 100 Å/s/Torr. Each step of the release process can be performed at room temperature.

In addition to the above etchants and etching methods mentioned for use in either the final release or in an intermediate etching step, there are others that may also be used by themselves or in combination. Some of these include wet etches, such as ACT, KOH, TMAH, HF (liquid); oxygen plasma, $SCCO_2$ (supercritical $CO_2$—the use of supercritical $CO_2$ as an etchant is described in U.S. patent application Ser. No. 10/167,272). Of course, the use of any of these etchants/methods requires that the material(s) to be etched are not resistant to the particular etchant used.

It will be appreciated by those of skill in the art that a new and useful hinge structure for a micro-mirror used in a spatial light modulator has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Also, the sacrificial layer and etchant disclosed herein are exemplary only. For example, a silicon dioxide sacrificial layer could be used and removed with HF (or HF/HCl), or a silicon sacrificial could be removed with $ClF_3$ or $BrF_3$. Also a PSG sacrificial layer could be removed with buffered HF, or an organic sacrificial such as polyimide could be removed in a dry plasma oxygen release step. Of course the etchant and sacrificial material should be selected depending upon the structural material to be used. Also, though PVD and CVD are referred to above, other thin film deposition methods could be used for depositing the layers, including spin-on, sputtering, anodization, oxidation, electroplating and evaporation. Therefore, the invention as described herein contemplates all such embodiments as may come within the scope of the following claims and equivalents thereof.

We claim:

1. A spatial light modulator comprising:
an array of micro-mirrors on a substrate, each micro-mirror of the array comprising a reflective mirror plate held by a hinge on the substrate, wherein the mirror plate and hinge extend substantially parallel to the substrate when the mirror plate is in an undeflected position, wherein the hinge is a multilayer hinge having a first and second layer wherein the first layer is more electrically conductive than the second layer, and wherein the first layer is more narrow than the second layer in a direction substantially parallel to the substrate.

2. The device of claim 1, wherein the first layer comprises an early transition metal.

3. The device of claim 2, wherein the early transition metal is a compound or alloy of titanium.

4. The device of claim 1, wherein the second layer comprises silicon.

5. The device of claim 4, wherein the first layer comprises a transiti on metal.

6. The device of claim 5, wherein the first layer comprises an early transition metal.

7. The device of claim 1, wherein the second layer is silicon oxide, silicon carbide, silicon nitride or polysilicon.

8. The device of claim 1, wherein the second layer has a resistivity higher than $10^{12}$ $\mu\Omega\cdot$cm.

9. The device of claim 1, wherein the first layer has a resistivity lower than 100,000 $\mu\Omega\cdot$cm.

10. The device of claim 8, wherein the bottom metal layer has a resistivity lower than 100,000 $\mu\Omega\cdot$cm.

11. The device of claim 1, wherein the first layer comprises a material with a higher creep rate than the second layer over the operating temperature of the device.

12. The device of claim 1, wherein the first layer covers the second layer by 50% or less of a top surface of the second layer.

13. The device of claim 1, wherein the second layer comprises a compound of silicon and the first layer comprises a compound of an early transition metal.

14. The device of claim 13, wherein the first layer comprises titanium nitride and the second layer comprises silicon nitride.

15. The device of claim 1, further comprising a third layer on an opposite side of the second layer from the first layer.

16. The device of claim 15, wherein the third layer comprises an early transition metal.

17. The device of claim 16, wherein the early transition metal is a compound or alloy of titanium.

18. The device of claim 15, wherein the second layer comprises silicon.

19. The device of claim 18, wherein the third layer comprises a transition metal.

20. The device of claim 19, wherein the first layer comprises an early transition metal.

21. The device of claim 15, wherein the second layer is silicon oxide, silicon carbide, silicon nitride or polysilicon.

22. The device of claim 15, wherein the second layer has a resistivity higher than $10^{12}$ $\mu\Omega\cdot$cm.

23. The device of claim 15, wherein the first and/or third layers have a resistivity lower than 100,000 $\mu\Omega\cdot$cm.

24. The device of claim 15, wherein both the first and third layers have a resistivity lower than 100,000 $\mu\Omega\cdot$cm.

25. The device of claim 15, wherein the first and third layers comprise a material with a higher creep rate than the second layer over the operating temperature of the device.

26. The device of claim 1, wherein the first layer covers the second layer by 50% or less of a top surface of the second layer and the third layer covers the second layer by 50% or less of a bottom surface of the second layer.

27. The device of claim 15, wherein the second layer is a multilayer structure comprising a plurality of layers of insulating materials.

28. The device of claim 1, wherein the first layer covers the second layer by 33% or less of a top surface of the second layer.

29. The device of claim 1, wherein the first layer covers the second layer by 25% or less of a top surface of the second layer.

30. The device of claim 1, wherein the first layer covers the second layer by 33% or less of a top surface of the second layer and the third layer covers the second layer by 33% or less of a bottom surface of the second layer.

31. The device of claim 1, wherein the first layer covers the second layer by 25% or less of a top surface of the second layer and the third layer covers the second layer by 25% or less of a bottom surface of the second layer.

32. The device of claim 1, wherein the hinge is a substantially elongated torsion hinge.

33. The device of claim 32, wherein the torsion hinge has a length and width, wherein the first layer is more narrow along the width of the hinge than the second layer.

34. A spatial light modulator comprising:
an array of micro-mirrors on a substrate, each micro-mirror of the array comprising a reflective mirror plate held by a hinge on the substrate at the contact, wherein the mirror plate and hinge extend substantially parallel to the substrate when the mirror plate is in an undeflected position, wherein the hinge is a multilayer hinge having a first and second layer wherein the first layer has a creep rate higher than that of the second layer at the operating temperature of the spatial light modulator, and wherein the first layer is more narrow than the second layer in a direction substantially parallel to the substrate.

35. The device of claim 34, wherein the first layer comprises an early transition metal.

36. The device of claim 35, wherein the early transition metal is a compound or alloy of titanium.

37. The device of claim 34, wherein the first layer comprises silicon.

38. The device of claim 37, wherein the first layer comprises a transition metal.

39. The device of claim 38, wherein the first layer comprises an early transition metal.

40. The device of claim 34, wherein the second layer is silicon oxide, silicon carbide, silicon nitride or polysilicon.

41. The device of claim 34, wherein the second layer has a resistivity higher than $10^{12}$ $\mu\Omega\cdot$cm.

42. The device of claim 34, wherein the first layer has a resistivity lower than 100,000 $\mu\Omega\cdot$cm.

43. The device of claim 41, wherein the bottom metal layer has a resistivity lower than 100,000 $\mu\Omega\cdot$cm.

44. The device of claim 34, wherein the first layer comprises a material with a higher electrical conductivity than the second layer.

45. The device of claim 34, wherein the first layer covers the second layer by 50% or less of a top surface of the second layer.

46. The device of claim 34, wherein the second layer comprises a compound of silicon and the first layer comprises a compound of an early transition metal.

47. The device of claim 46, wherein the first layer comprises titanium nitride and the second layer comprises silicon nitride.

48. The device of claim 34, further comprising a third layer on an opposite side of the second layer from the first layer.

49. The device of claim 48, wherein the third layer comprises an early transition metal.

50. The device of claim 49, wherein the early transition metal is a compound or alloy of titanium.

51. The device of claim 48, wherein the second layer comprises silicon.

52. The device of claim 51, wherein the third layer comprises a transition metal.

53. The device of claim 52, wherein the first layer comprises an early transition metal.

54. The device of claim 48, wherein the second layer is silicon oxide, silicon carbide, silicon nitride or polysilicon.

55. The device of claim 48, wherein the second layer has a resistivity higher than $10^{12}$ $\mu\Omega\cdot$cm.

56. The device of claim 48, wherein the first and/or third layers have a higher creep rate than the second layer.

57. The device of claim 48, wherein both the first and third layers have a higher creep rate than the second layer.

58. The device of claim 48, wherein the first and third layers comprise a material with a higher creep rate and a higher electrical conductivity than the second layer over the operating temperature of the device.

59. The device of claim 34, wherein the first layer covers the second layer by 50% or less of a top surface of the second layer and the third layer covers the second layer by 50% or less of a bottom surface of the second layer.

60. The device of claim 48, wherein the second layer is a multilayer structure comprising a plurality of layers of ceramic films.

61. The device of claim 34, wherein the second layer is a multilayer structure comprising a plurality of layers of ceramic films.

62. The device of claim 34, wherein the first layer covers the second layer by 33% or less of a top surface of the second layer.

63. The device e of claim 34, wherein the first layer covers the second layer by 25% or less of a top surface of the second layer.

64. The device of claim 34, wherein the first layer covers the second layer by 33% or less of a top surface of the second layer and the third layer covers the second layer by 33% or less of a bottom surface of the second layer.

65. The device of claim 34, wherein the first layer covers the second layer by 25% or less of a top surface of the second layer and the third layer covers the second layer by 25% or less of a bottom surface of the second layer.

66. A method of making a micro-mirror device, the device comprising a hinge and a micro-mirror plate attached to the hinge such that the micro-mirror plate can rotate relative to the substrate by the hinge, the method comprising:
providing a substrate;
depositing a first sacrificial layer on the substrate;
forming either a hinge or a micro-mirror plate on the first sacrificial layer;
depositing a second sacrificial layer;
forming a micro-mirror plate or hinge on the second sacrificial;
wherein the forming of the hinge on either the first or second sacrificial layer comprises:
depositing a second layer comprised of a material with a creep rate lower than that of the first layer;
depositing a first layer that comprises a material with a creep rate higher than that of the second layer;
patterning the first layer so as to have a width that is 50% or less of the width of the second layer; and
forming a hinge support to connect the hinge directly or indirectly to the substrate; and
removing the first and second sacrificial layers so as to release the micro-mirror device.

67. The method of claim 66, wherein the forming of the hinge further comprises:
depositing a third layer prior to depositing the second layer, the third layer
comprised of a material with a creep rate greater than that of the second
layer at the operating temperature of the device.

68. The method of claim 67, wherein prior to depositing the second first layer is patterned to have a width less than the width of the second layer after patterning.

69. The method of claim 68, wherein the third layer is patterned to have a width that is 50% or less of the width of the second layer after patterning.

70. The method of claim 66, wherein the first and third layers are patterned to have widths of 33% or less of the width of the second layer after patterning.

71. The method of claim 70, wherein the first and third layers are patterned to have widths of 25% or less of the width of the second layer after patterning.

72. A method of making a micro-mirror device, the device comprising a hinge and a micro-mirror plate attached to the hinge such that the micro-mirror plate can rotate relative to the substrate by the hinge, the method comprising:
providing a substrate;
depositing a first sacrificial layer on the substrate;
forming either a hinge or a micro-mirror plate on the first sacrificial layer;
depositing a second sacrificial layer;
forming a micro-mirror plate or hinge on the second sacrificial;
wherein the forming of the hinge on either the first or second sacrificial layer comprises:
depositing a second layer comprised of a material with a resistivity higher than $10^{12}$ $\mu\Omega\cdot$cm at the operating temperature of the device;
depositing a first layer that comprises a material with a resistivity less than that of the second layer;
patterning the first layer so as to have a width that is 50% or less of the width of the second layer; and
forming a hinge support to connect the hinge directly or indirectly to the substrate; and
removing the first and second sacrificial layers so as to release the micro-mirror device.

73. The method of claim 72, wherein the forming of the hinge further comprises: depositing a third layer prior to depositing the second layer, the third layer comprised of a material with a resistivity less than that of the second layer.

74. The method of claim 73, wherein prior to depositing the second layer the third layer is patterned to have a width less than the width of the second layer after patterning.

75. The method of claim 74, wherein the third layer is patterned to have a width that is 50% or less of the width of the second layer after patterning.

76. The method of claim 73, wherein the first and third layers are patterned to have widths of 33% or less of the width of the second layer after patterning.

77. The e method of claim 76, wherein the first and third layers are patterned to have widths of 25% or less of the width of the second layer after patterning.

78. A method of making a micro-mirror device, the device comprising a hinge and a micro-mirror plate attached to the hinge such that the micro-mirror plate can rotate relative to a substrate by the hinge, the method comprising:

provinding the substrate;

depositing a first sacrificial layer on t he substrate;

forming the micro-mirror plate on the first sacrificial layer;

depositing a second sacrificial layer on the micro-mirror plate;

patterning the second sacrificial layer according to a structure of the hinge;

forming the hinge on the patterned second sacrificial layer, further comprising:

depositing a bottom layer that comprises a material with resistivity higher than $10^{12}$ $\mu\Omega\cdot$cm at the operating temperature of the device;

depositing a top layer that comprises a material with resistivity lower than 100,000 $\mu\Omega\cdot$cm at the operating temperature of the device;

narrowing the topmost layer to cover at least 50% of the bottom layer surface by means of patterning and/or etching; and providing a means to connect the bottom and top layers directly or indirectly to the substrate; and removing the first and second sacrificial layers so that the bottom and top layers are free to move relative to the substrate.

79. The method of claim 78, wherein the hinge further comprises:

depositing a bottom layer comprised of a material with resistivity lower than 100,000 $\mu\Omega\cdot$cm at the operating temperature of the device;

depositing an intermediate layer that comprises a material with resistivity higher than $10^{12}$ $\mu\Omega\cdot$cm at the operating temperature of the device;

depositing a top layer that comprises a material with resistivity lower than 100,000 $\mu\Omega\cdot$cm at the operating temperature of the device;

narrowing the topmost layer to cover at least 50% of the bottom layer surface by means of patterning and/or etching; and providing a means to connect the bottom, intermediate, and top layers directly or indirectly to the substrate.

80. A method of making a micro-mirror device, the device comprising a hinge and a micro-mirror plate attached to the hinge such that the micro-mirror plate can rotate relative to a substrate by the hinge, the method comprising:

providing the substrate;

depositing a first sacrificial layer on the substrate;

forming the micro-mirror plate on the first sacrificial layer;

depositing a second sacrificial layer on the micro-mirror plate;

patterning the second sacrificial layer;

forming the hinge on the patterned second sacrificial layer so as to connect to both the micro-mirror plate and the substrate, the forming the hinge comprising:

depositing a layer that comprises an electrical conductor;

depositing a layer that comprises an electrical insulator;

depositing a layer that comprises an electrical conductor, wherein at least one of the electrical conductor layers has a width 50% or less than that of the width of the insulator; and removing the first and second sacrificial layers such that the micro-mirror plate is free to move relative to the substrate .

81. The method of claim 80, wherein the insulator layers comprise silicon nitride.

82. The method of claim 80, wherein the insulator layers comprise silicon oxide or silicon carbide.

83. The method of claim m 80, wherein the conducting layers comprise titanium.

84. The method of claim 80, wherein the conducting layers comprise a titanium alloy or titanium compound.

85. A micromirror device, comprising:

a substrate;

a mirror plate; and a hinge, to which the mirror plate is attached such that the mirror plate rotates along the hinge, the hinge further comprising:

a first layer having a first stress gradient;

a second layer formed on and contact the first layer such that the first layer has a stress gradient that is less than the first stress gradient.

86. The device of claim 85, wherein the first layer has a principal axis and the second layer has a second principal axis; and wherein the first and second axes are not aligned when viewed from the top of the two layers.

87. The device of claim 85, wherein the second hinge layer has a width that is shorter than a width of the first layer.

88. The method of claim 85, wherein the hinge further comprises:

a third layer on which the first layer is formed, wherein the third layer has a width that is shorter than a width of the first layer.

89. The method of claim 88, further comprising:

a fourth layer disposed on the three layers including the first, second and third layers such that the three layers are wrapped by the fourth layer.

90. The device of claim 1, wherein the width of the first layer of the multilayer hinge is non-uniform along the length of the first layer.

91. The device of claim 90, wherein the second layer of the multilayer hinge is non-uniform along the length of the second layer.

92. A microelectromechanical device comprising:

a movable element on a substrate, each movable element comprising a plate held by a hinge on the substrate, wherein the plate and hinge extend substantially parallel to the substrate when the plate is in an undeflected position, wherein the hinge is a multilayer hinge having a first layer that is more electrically conductive than a second layer, and wherein the first layer is more narrow than the second layer in a direction substantially parallel to the substrate.

\* \* \* \* \*